United States Patent
Hamada et al.

(10) Patent No.: US 12,133,400 B2
(45) Date of Patent: Oct. 29, 2024

(54) ORGANIC LIGHT-EMITTING DEVICE, DISPLAY DEVICE, ELECTRONIC APPARATUS, ONBOARD DISPLAY, AND VEHICLE

(71) Applicant: Wuhan Tianma Micro-Electronics Co., Ltd., China (CN)

(72) Inventors: Keita Hamada, Kanagawa (JP); Hiromu Hanashima, Kanagawa (JP); Shigeru Mori, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 247 days.

(21) Appl. No.: 17/384,876

(22) Filed: Jul. 26, 2021

(65) Prior Publication Data
US 2022/0037607 A1  Feb. 3, 2022

(30) Foreign Application Priority Data

Jul. 31, 2020 (JP) .................. 2020-129868
Apr. 15, 2021 (JP) .................. 2021-068930

(51) Int. Cl.
*H10K 50/11* (2023.01)
*B60K 35/60* (2024.01)
(Continued)

(52) U.S. Cl.
CPC .............. *H10K 50/11* (2023.02); *B60K 35/60* (2024.01); *H10K 50/15* (2023.02); *H10K 50/16* (2023.02);
(Continued)

(58) Field of Classification Search
CPC ........ H10K 50/11; H10K 50/15; H10K 50/16; H10K 50/171; H10K 2101/30;
(Continued)

(56) References Cited

U.S. PATENT DOCUMENTS

| 8,685,540 B2 * | 4/2014 | Adamovich | ........... H10K 50/15 |
| | | | 428/917 |
| 2002/0086180 A1 | 7/2002 | Seo et al. | |

(Continued)

FOREIGN PATENT DOCUMENTS

| JP | 2000-243574 A | 9/2000 |
| JP | 2002-313583 A | 10/2002 |

(Continued)

OTHER PUBLICATIONS

Office Action issued Jul. 9, 2024 in Japanese Application No. 2021-068930.

*Primary Examiner* — Moin M Rahman
(74) *Attorney, Agent, or Firm* — Sughrue Mion, PLLC

(57) ABSTRACT

An organic light-emitting device includes an anode electrode and a cathode electrode that are arranged facing each other; a light-emitting layer arranged between the anode electrode and the cathode electrode; and a hole transport layer arranged between the anode electrode and the light-emitting layer, and including one or more layers. A layer, of the one or more layers of the hole transport layer, contacting the light-emitting layer has a HOMO energy level 12*b*H that is higher than a HOMO energy level 13H of the light-emitting layer. A difference $\Delta E1$ between the HOMO energy level 12*b*H of the layer contacting the light-emitting layer of the hole transport layer and the HOMO energy level 13H of the light-emitting layer is 0.32 eV or less.

14 Claims, 13 Drawing Sheets

(51) Int. Cl.
    *H10K 50/15* (2023.01)
    *H10K 50/16* (2023.01)
    *H10K 50/17* (2023.01)
    *B60K 35/22* (2024.01)
    *H10K 101/30* (2023.01)
    *H10K 101/40* (2023.01)
    *H10K 102/00* (2023.01)

(52) U.S. Cl.
    CPC ............ *H10K 50/171* (2023.02); *B60K 35/22* (2024.01); *B60K 2360/1523* (2024.01); *H10K 2101/30* (2023.02); *H10K 2101/40* (2023.02); *H10K 2102/351* (2023.02)

(58) Field of Classification Search
    CPC ......... H10K 2101/40; H10K 2102/351; H10K 50/852; H10K 59/35; H10K 59/12; H10K 50/156; H10K 50/10–19; H10K 50/00–88; H10K 59/00–95; H10K 65/00; H10K 71/00–861; H10K 85/00–791; H10K 2101/00–90; H10K 2102/00–36; B60K 37/02; B60K 2370/1523; B60K 2370/331; B60K 2370/52; B60R 1/00; H01L 33/20; H01L 51/5209; H01L 27/322; H01L 27/3258; H01L 51/00; H01L 33/58; H01L 27/1248; H01L 33/505; H01L 29/78633; H01L 27/3244; H01L 51/526; H01L 51/5262
    See application file for complete search history.

(56) References Cited

U.S. PATENT DOCUMENTS

| | | |
|---|---|---|
| 2006/0263636 A1 | 11/2006 | Ohsawa et al. |
| 2006/0279204 A1 | 12/2006 | Forrest et al. |
| 2007/0103065 A1 | 5/2007 | Fukuoka et al. |
| 2007/0205713 A1 | 9/2007 | Okinaka et al. |
| 2009/0033211 A1 | 2/2009 | Tanabe et al. |
| 2009/0200918 A1 | 8/2009 | Seo et al. |
| 2014/0014940 A1 | 1/2014 | Pflumm et al. |
| 2017/0012231 A1 | 1/2017 | Mishima et al. |
| 2019/0051834 A1* | 2/2019 | Liu ................. H10K 85/624 |
| 2019/0198794 A1* | 6/2019 | Kim ................. H10K 50/82 |
| 2020/0266375 A1* | 8/2020 | Li ................... H10K 50/18 |
| 2022/0393128 A1* | 12/2022 | Lee ................. H10K 50/13 |

FOREIGN PATENT DOCUMENTS

| | | |
|---|---|---|
| JP | 2002-324676 A | 11/2002 |
| JP | 2004-362914 A | 12/2004 |
| JP | 2006-352102 A | 12/2006 |
| JP | 2007-165734 A | 6/2007 |
| JP | 2007-266160 A | 10/2007 |
| JP | 2008-535266 A | 8/2008 |
| JP | 2009-218581 A | 9/2009 |
| JP | 2014-513418 A | 5/2014 |
| JP | 2017-22369 A | 1/2017 |
| JP | 2017-212042 A | 11/2017 |
| JP | 2018-206981 A | 12/2018 |

* cited by examiner

ORGANIC LIGHT-EMITTING DEVICE, DISPLAY DEVICE, ELECTRONIC APPARATUS, ONBOARD DISPLAY, AND VEHICLE

CROSS-REFERENCE TO RELATED APPLICATION

This application claims the benefit of Japanese Patent Application No. 2020-129868, filed on Jul. 31, 2020, and Japanese Patent Application No. 2021-068930, filed on Apr. 15, 2021, of which the entirety of the disclosures is incorporated by reference herein.

FIELD

The present disclosure relates generally to an organic light-emitting device, a display device, an electronic apparatus, an onboard display, and a vehicle.

BACKGROUND

Light emitting devices called organic electro-luminescence (EL) devices include a light-emitting layer including an organic light-emitting material, and an anode electrode and a cathode electrode that sandwich the light-emitting layer. Additionally, in order to improve the luminous efficiency of the organic EL device, a hole transport layer or a hole injection layer is provided between the anode electrode and the light-emitting layer, and an electron transport layer or an electron injection layer is provided between the cathode electrode and the light-emitting layer (for example, see Unexamined Japanese Patent Application Publication (Translation of PCT Application) No. 2008-535266, Unexamined Japanese Patent Application Publication (Translation of PCT Application) No. 2014-513418, and Unexamined Japanese Patent Application Publication No. 2017-022369).

It is known that the life of organic EL devices shortens in high temperature environments. It is preferable that organic EL devices that are exposed to various environments (for example, organic EL devices mounted in vehicles) have a longer life in high temperature environments.

SUMMARY

An organic light-emitting device according to Embodiment 1 of the present disclosure includes an anode electrode and a cathode electrode that are arranged facing each other; a light-emitting layer arranged between the anode electrode and the cathode electrode; and a hole transport layer arranged between the anode electrode and the light-emitting layer, and one or more layers, wherein a layer, of the one or more layers of the hole transport layer, contacting the light-emitting layer has a HOMO energy level that is higher than a HOMO energy level of the light-emitting layer, and a difference between the HOMO energy level of the layer contacting the light-emitting layer of the hole transport layer and the HOMO energy level of the light-emitting layer is 0.32 eV or less.

A display device according to Embodiment 2 of the present disclosure includes the organic light-emitting device according to Embodiment 1.

An onboard display according to Embodiment 3 of the present disclosure includes the display device according to Embodiment 2.

An electronic apparatus according to Embodiment 4 of the present disclosure includes the display device according to Embodiment 2.

A vehicle according to Embodiment 5 of the present disclosure includes the onboard display according to Embodiment 3.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which.

DETAILED DESCRIPTION

Hereinafter, an organic light-emitting device, a display device, an electronic apparatus, an onboard display, and a vehicle according to embodiments of the present disclosure are described while referencing the drawings.

Embodiment 1

Figure 1:
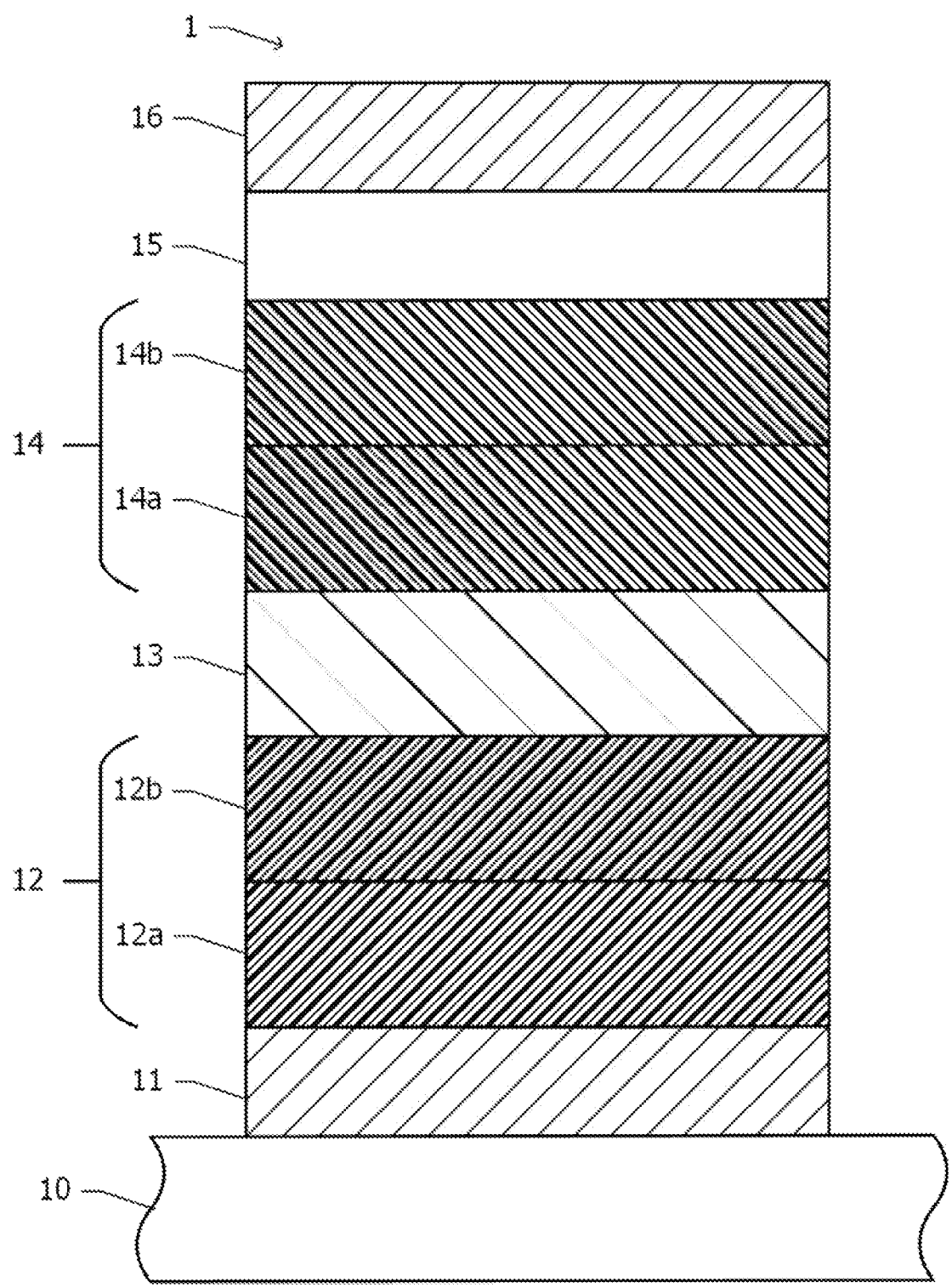
FIG. 1 is a cross-sectional view illustrating the structure of an organic light-emitting device according to Embodiment 1.

Firstly, the structure and configuration of an organic light-emitting device 1 according to the present embodiment is described while referencing FIG. 1. The organic light-emitting device 1 includes an anode electrode 11 arranged on an insulation substrate 10, a hole transport layer 12 arranged above the anode electrode 11, a light-emitting layer 13 arranged above the hole transport layer 12, an electron transport layer 14 arranged above the light-emitting layer 13, an electron injection layer 15 arranged above the electron transport layer 14, and a cathode electrode 16 arranged above the electron injection layer 15. In one example, this type of organic light-emitting device 1 is used in an onboard display.

The anode electrode 11 is connected to a non-illustrated power supply, and supplies holes to the hole transport layer 12. A material that is translucent and electrically conductive is used as the material that forms the anode electrode 11. Examples of materials that can be used include indium tin oxide (ITO), tin oxide ($SnO_2$), indium zinc oxide (IZO), and the like. Note that, when emitting light toward the cathode side by reflecting the light on the insulation substrate 10 side as in a top emission structure, it is possible to use an anode electrode in which ITO or IZO is disposed on the surface of a reflective metal such as silver (Ag) or the like.

The hole transport layer 12 efficiently transports, to the light-emitting layer 13, the holes injected from the anode electrode 11. In general, a band gap of the hole transport layer 12 is larger than a band gap of the light-emitting layer 13. Note that, the term "band gap" refers to the energy difference between the energy level of the lowest unoccupied molecular orbital (LUMO) and the energy level of the highest occupied molecular orbital (HOMO).

In the present embodiment, the hole transport layer 12 includes a first hole transport layer 12a and a second hole transport layer 12b. Known materials are used as the materials that form the first hole transport layer 12a and the second hole transport layer 12b, respectively. Examples of the materials include α-NPD (name: 2,2'-Dimethyl-N, N'-di-[(1-naphthyl)-N, N'-diphenyl]-1,1'-biphenyl-4,4'-diamine), TAPC (name: 4,4'-Cyclohexylidenebis [N, N-bis (4-methylphenyl) benzenamine]), TPD (name: N,N'-Bis (3-methylphenyl)-N, N'-diphenylbenzidine), and the like. It is preferable that the second hole transport layer 12b arranged contacting the light-emitting layer 13 has a thickness of from 5 nm to 50 nm.

The light-emitting layer 13 is a layer in which the holes injected from the anode electrode 11 and the electrons injected from the cathode electrode 16 efficiently recombine, and the light-emitting layer 13 emits light as a result of this recombination. A known material such as a fluorescent material, a thermally activated delayed fluorescent material, a phosphorescent material, or the like is used to form the light-emitting layer 13. Examples of the material include bistylylbenzene derivative, $Alq_3$ (name: Tris-(8-hydroxyquinoline) aluminum), rubrene, dimethylkinaccrydone, FIrpic (name: Bis[2-(4,6-difluorophenyl) pyridinato-C2, N] (picolinato) iridium (III)), $Ir(ppy)_3$ (name: Tris[2-phenylpyridinato-C2, N] iridium (III)), (Ppy)2Ir(acac) (name: Bis[2-(2-pyridinyl-N) phenyl-C] (2,4-pentanedionato-O2, O4) iridium (III)), and the like.

The electron transport layer 14 efficiently transports, to the light-emitting layer 13, the electrons injected from the electron injection layer 15. In the present embodiment, the electron transport layer 14 includes a first electron transport layer 14a and a second electron transport layer 14b. Known materials are used to form the first electron transport layer 14a and the second electron transport layer 14b, respectively. Examples of the materials include $Alq_3$, BCP (name: 3-Benzidino-6-(4-chlorophenyl) pyridazine), siror derivative, and the like.

The electron injection layer 15 efficiently injects, into the electron transport layer 14, the electrons injected from the cathode electrode 16. Examples of materials that can be used to form the electron injection layer 15 include lithium fluoride (LiF), ytterbium (Yb), Liq (name: 8-Hydroxyquinolato-lithium), and the like.

The cathode electrode 16 is connected to a non-illustrated power supply, and supplies electrons to the electron injection layer 15. Examples of materials that can be used to form the cathode electrode 16 include aluminum, magnesium/silver alloy, ITO, IZO, and the like.

Figure 2:
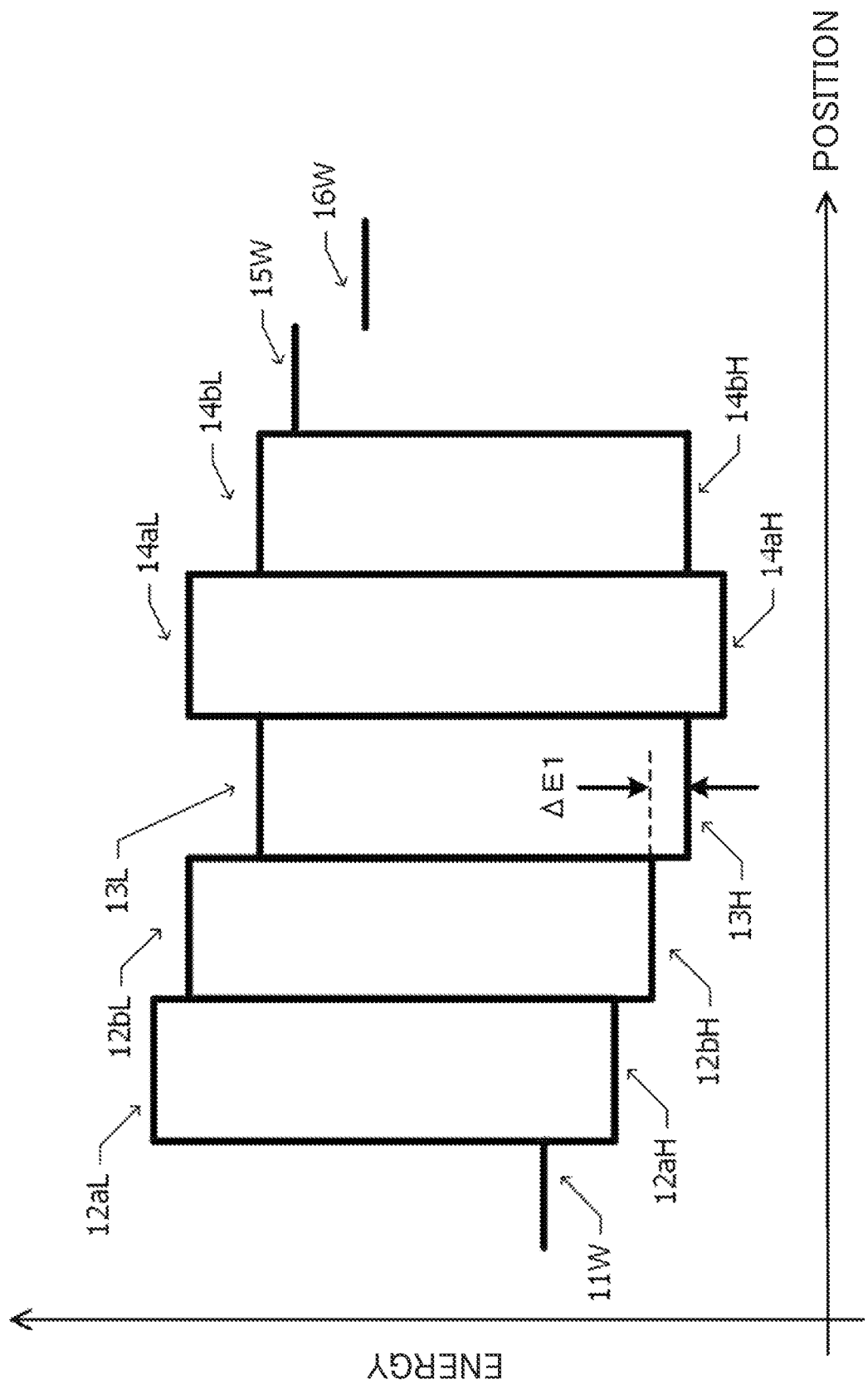
FIG. 2 is an energy state diagram of the organic light-emitting device according to Embodiment 1.

FIG. 2 illustrates the energy states of the various layers of the organic light-emitting device 1. In FIG. 2, reference numeral 11W represents the work function of the anode electrode 11. Reference numeral 12aH represents the HOMO energy level of the first hole transport layer 12a, and reference numeral 12aL represents the LUMO energy level of the first hole transport layer 12a. Reference numeral 12bH represents the HOMO energy level of the second hole transport layer 12b and reference numeral 12bL represents the LUMO energy level of the second hole transport layer 12b. Reference numeral 13H represents the HOMO energy level of the light-emitting layer 13, and reference numeral 13L represents the LUMO energy level of the light-emitting layer 13. Reference numeral 14aH represents the HOMO energy level of the first electron transport layer 14a, and reference numeral 14aL represents the LUMO energy level of the first electron transport layer 14a. Reference numeral 14bH represents the HOMO energy level of the second electron transport layer 14b, and reference numeral 14bL represents the LUMO energy level of the second electron transport layer 14b. Reference numeral 15W represents the work function of the electron injection layer 15, and reference numeral 16W represents the work function of the cathode electrode 16. In Embodiment 1, the energy states of the various layers of the organic light-emitting device 1 have the following particularly prominent characteristic.

In Embodiment 1, the HOMO energy level 12bH of the second hole transport layer 12b that contacts the light-emitting layer 13 is higher than the HOMO energy level 13H of the light-emitting layer 13. Specifically, the energy of the HOMO energy level 12bH is 0.32 eV or less higher than the HOMO energy level 13H of the light-emitting layer 13. In other words, an energy difference $\Delta E1$ obtained by subtracting the HOMO energy level 13H of the light-emitting layer 13 from the HOMO energy level 12bH of the second hole transport layer 12b is in a range of greater than 0 eV and 0.32 eV or less (0 eV < $\Delta E1$ ≤ 0.32 eV).

Next, a description of the advantageous effects exhibited as a result of having this prominent characteristic is given while referencing high-temperature life characteristic of the organic light-emitting device 1. Having these prominent characteristics results in the life of the organic light-emitting device 1 in high temperature environments being longer.

Figure 3:
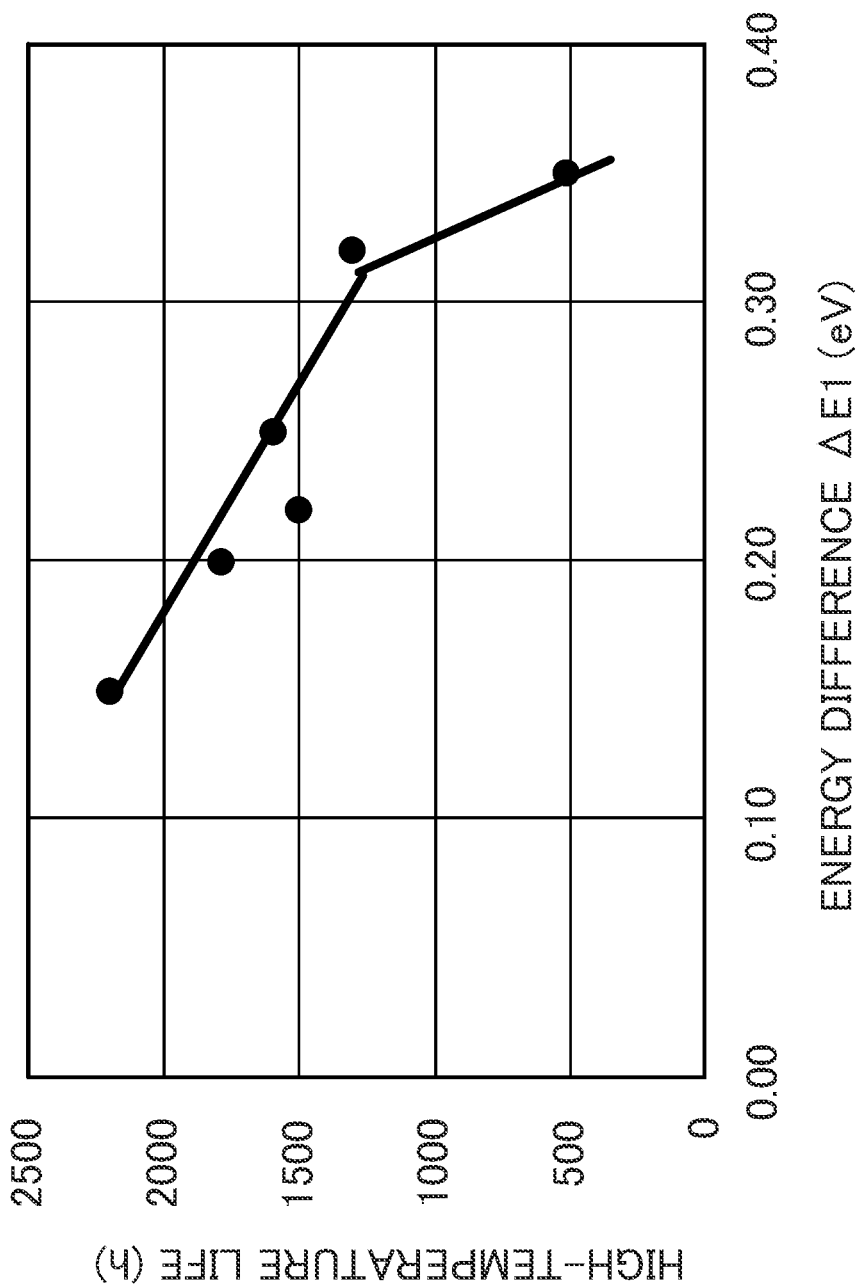
FIG. 3 is a graph illustrating the relationship between an energy difference $\Delta E1$ obtained by subtracting a HOMO energy level of a light-emitting layer from a HOMO energy level of a hole transport layer contacting the light-emitting layer, and life in high temperature environments (high-temperature life)

FIG. 3 illustrates a graph that illustrates the relationship between the energy difference $\Delta E1$ [eV] (horizontal axis) and high-temperature life [h] (vertical axis). Hereinafter, in the present disclosure, the term "high-temperature life" refers to an amount of time (hours) it takes for the intensity of the light emitted by the organic light-emitting device 1 to decrease 20% compared to an initial intensity, when the organic light-emitting device 1 is driven continuously at a current density of 10 mA/cm² in an 85° C. environment.

As illustrated in FIG. 3, as the energy difference ΔE1 increases, the high-temperature life monotonically decreases. In other words, the high-temperature life increases as the energy difference ΔE1 decreases. Additionally, as illustrated in FIG. 3, the characteristics (rate of change, slope) of the high-temperature life change in the range where the energy difference ΔE1 is 0.32 eV or less, and the range where the energy difference ΔE1 is greater than 0.32 eV. Therefore, the high-temperature life of the organic light-emitting device 1 can be lengthened by reducing the energy difference ΔE1, and specifically by setting the energy difference ΔE1 to 0.32 eV or less.

Note that, in general, the energy difference ΔE1 must be greater than 0 eV in order to inject holes into the light-emitting layer 13 from the second hole transport layer 12b. This is because, if the energy difference ΔE1 is 0 eV or less, it will be difficult for the holes flowing through the second hole transport layer 12b to overcome the barrier of the light-emitting layer 13. As such, it is preferable that the energy difference ΔE1 is set to greater than 0 eV and 0.32 eV or less. By setting the energy difference ΔE1 to greater than 0 eV and 0.32 eV or less in this manner, the life of the organic light-emitting device 1 in high temperature environments can be lengthened even more. This relationship is particularly prominent when using a luminescent material for the light-emitting layer 13 that exhibits a blue color or uses fluorescence, for example. This is because, in a light emitting element in which hole-electron recombination is active near the interface between the second hole transport layer 12b and the light-emitting layer 13, recombination, that is, light emission, changes sensitively with respect to the energy difference between the two layers.

Note that, the materials of the second hole transport layer 12b and the light-emitting layer 13 whereby the relationship 0 eV<ΔE1≤0.32 eV is satisfied can be selected as appropriate. For example, the HOMO energy levels of the second hole transport layer 12b and the light-emitting layer 13 can be measured using generally known atmospheric photoelectron yield spectroscopy. The band gap of each layer can be measured using generally known ultraviolet-visible near-infrared spectroscopy, and the LUMO energy level of each layer can be calculated from the measured HOMO energy level and band gap of each layer. Using such measurement methods makes it possible to select a suitable material to be used for each layer. Provided that the relationship 0 eV<ΔE1≤0.32 eV is satisfied, any material may be used for the material of each layer.

Figure 8:
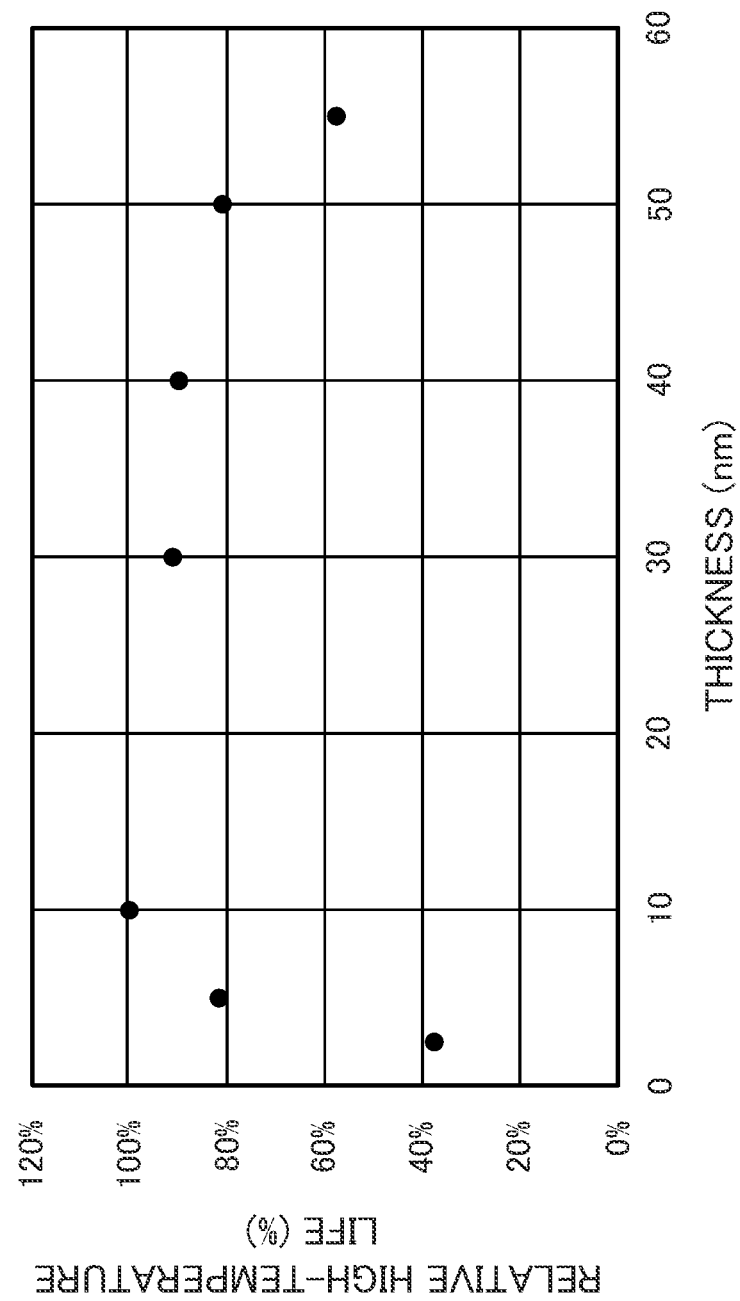
FIG. 8 is a graph illustrating the relationship between a thickness of a second hole transport layer arranged contacting the light-emitting layer, and a relative high-temperature life.

FIG. 8 is a graph illustrating the relationship between a thickness [nm] of the second hole transport layer arranged contacting the light-emitting layer, and the relative high-temperature life [%], under the condition of 0 eV<ΔE1≤0.32 eV being satisfied. In the present disclosure, the relative high-temperature life is a relative value of the high-temperature life at various thicknesses with respect to a peak value of the high-temperature life. In FIG. 8, the high-temperature life at a thickness of 10 nm is the peak value.

It is known that, in general, a film using an organic material must have a certain amount of thickness in order to function as a film responsible for hole transport (hole transport layer). When the thickness is thin, the function as a hole transport layer is insufficient, and the life of the organic light-emitting device tends to be remarkably shorter. Additionally, it is known that, in general, the supply of holes becomes increasingly obstructed as the thickness of a hole transport layer using an organic material increases. As such, the life tends to shorten with increases in the thickness of the hole transport layer after the thickness at which the high-temperature life of the light emitting device peaks is exceeded.

As illustrated in FIG. 8, when the thickness of the second hole transport layer 12b is less than 5 nm, the life of the organic light-emitting device 1 shortens significantly. However, when the thickness of the second hole transport layer 12b exceeds 50 nm, the decrease in the supply amount of holes becomes prominent, and the high-temperature life decreases significantly. As illustrated in FIG. 8, in order to demonstrate relative high-temperature life of 80% or greater, it is preferable that the thickness of the second hole transport layer 12b arranged contacting the light-emitting layer 13 is from 5 nm to 50 nm.

When adopting the conditions described above for the second hole transport layer 12b, the thickness for obtaining an enhancing effect based on optical resonance (the thicknesses of the anode and light emitting layers) in a top emission structure or the like may be insufficient. In such a case, optical adjustment is performed by the first hole transport layer 12a.

The various layers of the organic light-emitting device 1 may be formed by general film forming methods suited to the materials to be used. In one example, the organic light-emitting device 1 can be produced by the following manufacturing method.

Firstly, the anode electrode 11 made from ITO, for example, is formed by a sputtering method on a surface of the insulation substrate 10 that is prepared in advance. Next, the first hole transport layer 12a to the cathode electrode 16 are sequentially formed on the anode electrode 11 by a vacuum deposition method, for example. In one example, the organic light-emitting device can be produced by such a manufacturing method.

Note that the present disclosure can also be applied to an organic light-emitting device that includes pixels for each light emitting element that has a different color such as red, green, and blue. In such a case, firstly, a transistor is formed on the insulation substrate 10, and the anode electrode 11 is formed on that insulation substrate 10 by a sputtering method. Thereafter, a pixel definition layer is formed using an organic film. Next, the first hole transport layer 12a to the cathode electrode 16 are sequentially formed by a vacuum deposition method on the anode electrode 11 within the opened region of the pixel definition layer. Thus, an organic light-emitting device including pixels using each of red, green, and blue light emitting elements can be produced.

Embodiment 2

Next, as Embodiment 2, an organic light-emitting device 1 for which life in high temperature environments is further improved is described. Note that the organic light-emitting device 1 according to Embodiment 2 has the same structure (the structure illustrated in FIG. 1) as the organic light-emitting device 1 according to Embodiment 1.

Figure 4:
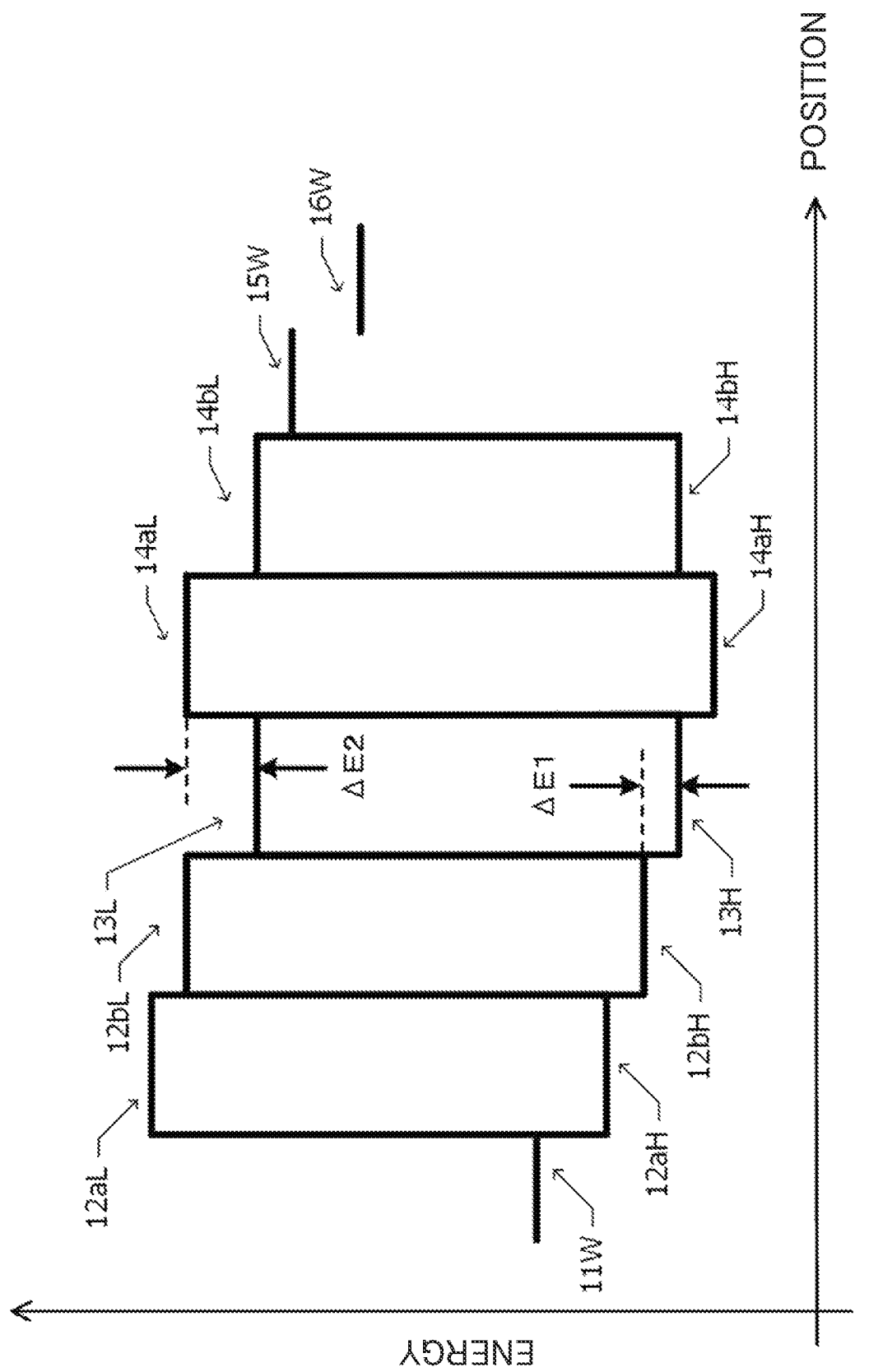
FIG. 4 is an energy state diagram of an organic light-emitting device according to Embodiment 2.

FIG. 4 illustrates the energy states of the various layers of the organic light-emitting device 1 in Embodiment 2. In Embodiment 2, the energy states of the various layers of the organic light-emitting device 1 have the following particularly prominent characteristics.

In Embodiment 2, an absolute value of the LUMO energy level 14aL of the first electron transport layer 14a that contacts the light-emitting layer 13 is less than or equal to an absolute value of the LUMO energy level 13L of the light-emitting layer 13. In other words, an energy difference ΔE2 obtained by subtracting the absolute value of the LUMO energy level 13L of the light-emitting layer 13 from the absolute value of the LUMO energy level 14aL of the first electron transport layer 14a is 0 eV or less (ΔE2≤0 eV). It is preferable that the first electron transport layer 14a arranged contacting the light-emitting layer 13 has a thickness of from 5 nm to 50 nm. In addition, it is further preferable that the first electron transport layer 14a has a thickness of from 5 nm to 30 nm, and particularly preferable that the first electron transport layer 14a has a thickness of from 10 nm to 30 nm.

Figure 5:
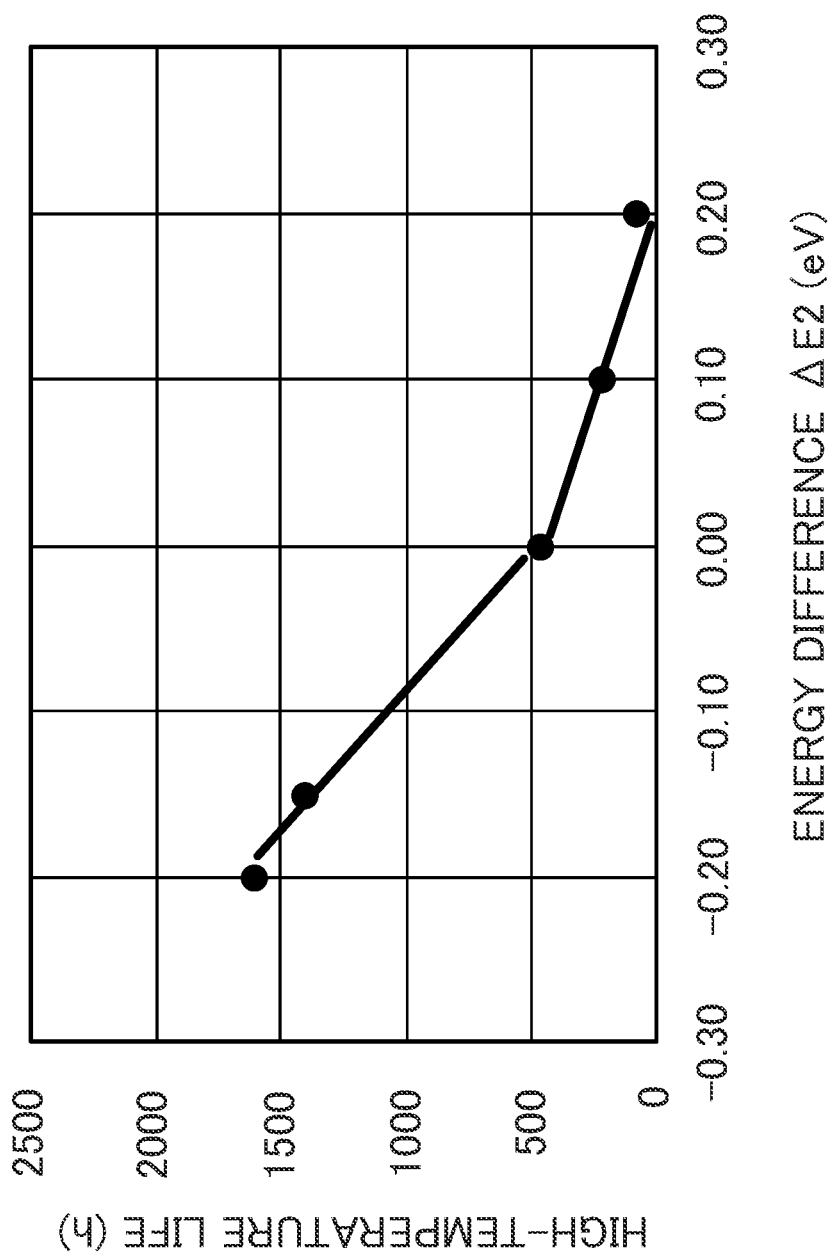
FIG. 5 is a graph illustrating the relationship between an energy difference $\Delta E2$ obtained by subtracting a LUMO energy level of a light-emitting layer from a LUMO energy level of an electron transport layer contacting the light-emitting layer, and life in high temperature environments (high-temperature life)

FIG. 5 illustrates a graph that illustrates the relationship between the energy difference ΔE2 [eV] (horizontal axis) and high-temperature life [h] (vertical axis). As illustrated in FIG. 5, as the energy difference ΔE2 increases, the high-temperature life monotonically decreases. In other words, the high-temperature life increases as the energy difference ΔE2 decreases. Additionally, as illustrated in FIG. 5, the characteristics (rate of change, slope) of the high-temperature life change in the range where the energy difference ΔE2 is 0 eV or less, and the range where the energy difference ΔE2 is greater than 0 eV. Therefore, the high-temperature life of the organic light-emitting device 1 can be lengthened by reducing the energy difference ΔE2, and specifically by setting the energy difference ΔE2 to 0 eV or less.

Note that materials of the light-emitting layer 13 and the first electron transport layer 14a whereby the relationship ΔE2≤0 eV is satisfied can be selected as appropriate. Using atmospheric photoelectron yield spectroscopy, ultraviolet-visible near-infrared spectroscopy, or the like makes it possible to select a suitable material to be used for each layer. Provided that the relationship ΔE2≤0 eV is satisfied, any material may be used for the material of each layer.

Figure 9:
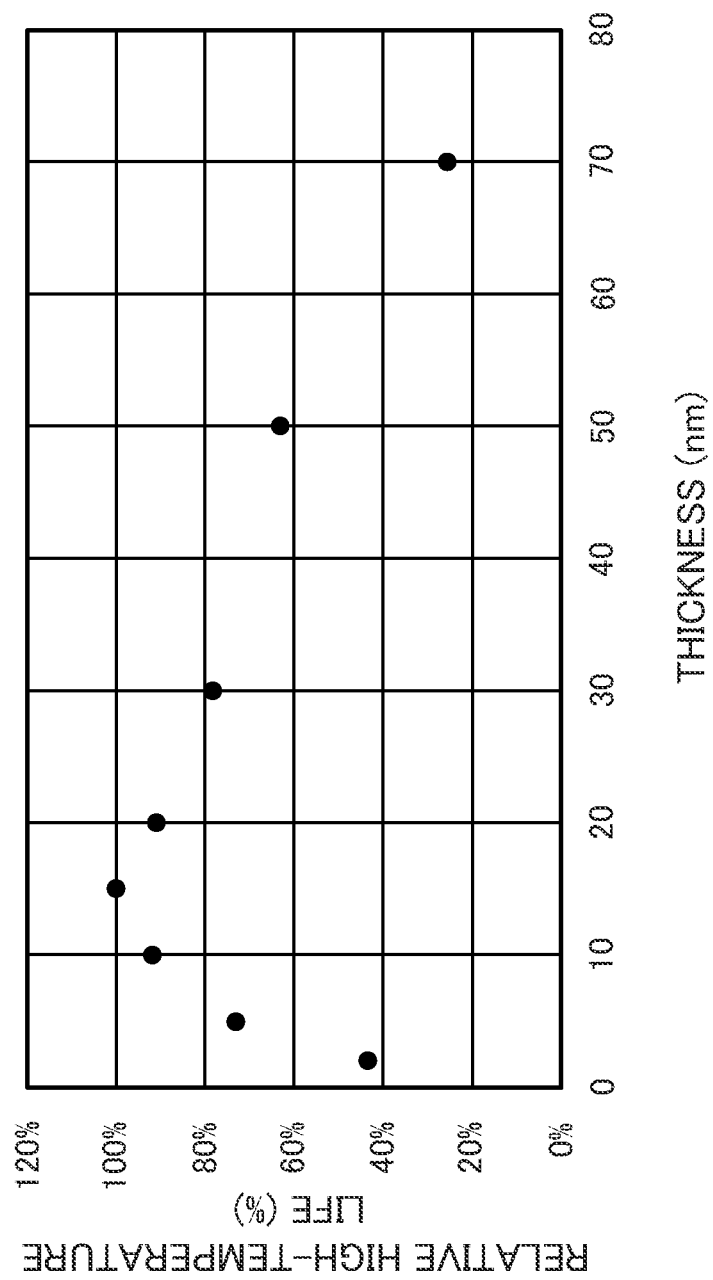
FIG. 9 is a graph illustrating the relationship between a thickness of a first electron transport layer arranged contacting the light-emitting layer, and a relative high-temperature life.

FIG. 9 illustrates the relationship between the thickness [nm] of the first electron transport layer 14a arranged contacting the light-emitting layer 13, and the relative high-temperature life [%], under the condition of ΔE2≤0 eV being satisfied. In the present disclosure, the relative high-temperature life is a relative value of the high-temperature life at various thicknesses with respect to the peak value of the high-temperature life. In FIG. 9, the high-temperature life at a thickness of 15 nm is the peak value.

As with the hole transport layer, it is known that, in general, a film using an organic material must have a certain amount of thickness in order to function as a film responsible for electron transport (electron transport layer). When the thickness is thin, the function as an electron transport layer is insufficient, and the life of the organic light-emitting device tends to be remarkably shorter. Additionally, it is known that, in general, the supply of electrons becomes increasingly obstructed as the thickness of an electron transport layer using an organic material increases. As such, the life tends to shorten with increases in the thickness of the electron transport layer after the thickness at which the high-temperature life of the light emitting device peaks is exceeded.

As illustrated in FIG. 9, when the thickness of the first electron transport layer 14a is less than 5 nm, the life of the organic light-emitting device 1 shortens significantly. Meanwhile, when the thickness of the first electron transport layer 14a exceeds 50 nm, the decrease in the supply amount of electrons becomes prominent, and the high-temperature life decreases significantly. As illustrated in FIG. 9, in order to demonstrate relative high-temperature life of 60% or greater, it is preferable that the thickness of the first electron transport layer 14a arranged contacting the light-emitting layer 13 is from 5 nm to 50 nm. Additionally, it is further preferable that the thickness of the first electron transport layer 14a is from 5 nm to 30 nm, whereby a relative high-temperature life of 70% or greater can be obtained. It is particularly preferable that the thickness of the first electron transport layer 14a is from 10 nm to 30 nm, since a relative high-temperature life of about 80% or greater can be obtained.

When adopting the conditions described above for the first electron transport layer 14a, the thickness for obtaining an enhancing effect based on optical resonance (the thicknesses of cathode and light emitting layers) in a top emission structure or the like may be insufficient. In such a case, optical adjustment is performed by the second electron transport layer 14b.

Embodiment 3

Next, as Embodiment 3, an organic light-emitting device 1 for which the life in high temperature environments is further improved is described. Note that the organic light-emitting device 1 according to Embodiment 3 has the same structure (the structure illustrated in FIG. 1) as the organic light-emitting device 1 according to Embodiment 1.

Figure 6:
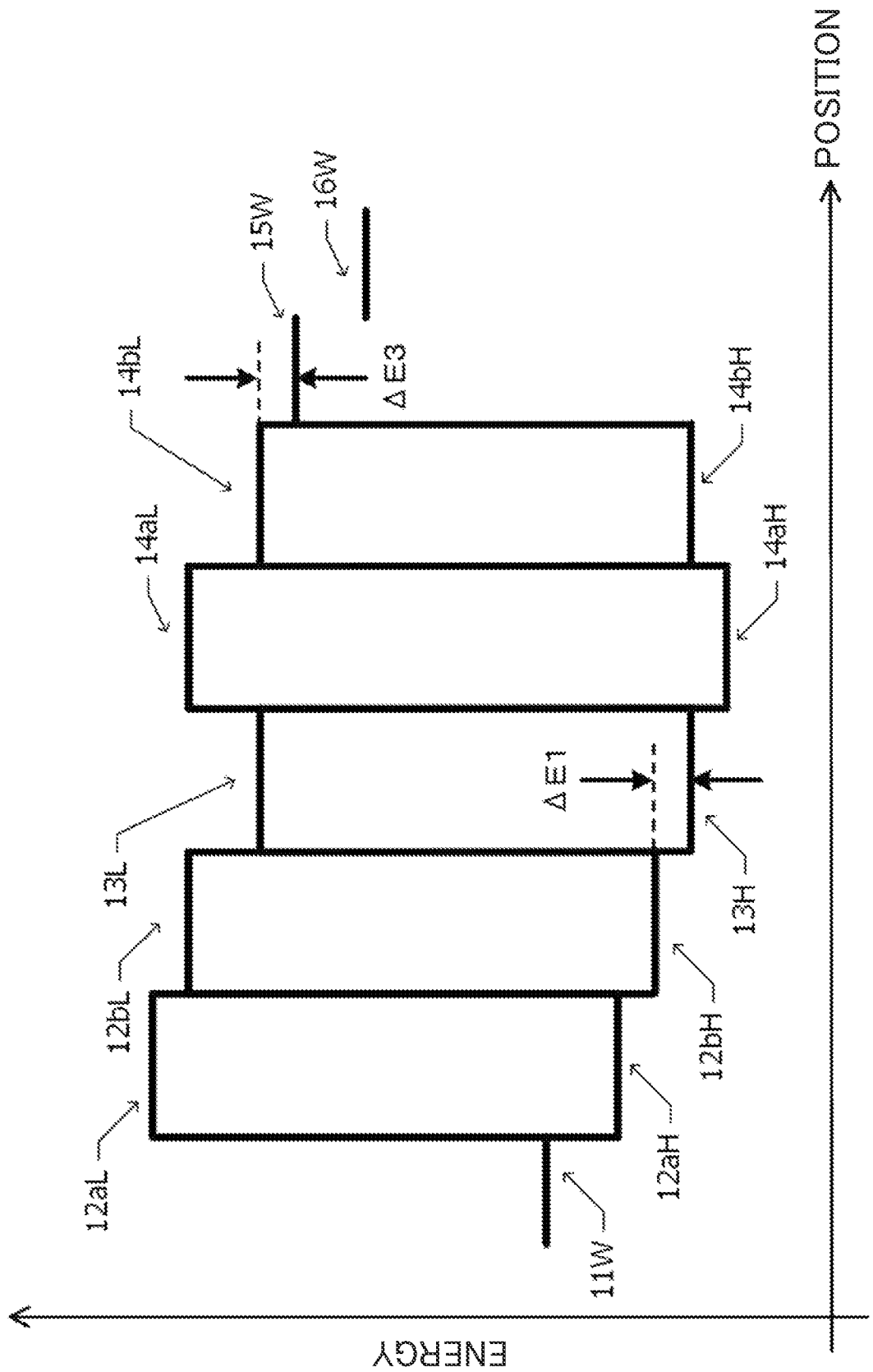
FIG. 6 is an energy state diagram of an organic light-emitting device according to Embodiment 3.

FIG. 6 illustrates the energy states of the various layers of the organic light-emitting device 1 in Embodiment 3. In Embodiment 3, the energy states of the various layers of the organic light-emitting device 1 have the following particularly prominent characteristics.

In Embodiment 3, an absolute value of the LUMO energy level 14bL of the second electron transport layer 14b is less than or equal to an absolute value of the work function 15W of the electron injection layer 15. In other words, an energy difference ΔE3 obtained by subtracting the absolute value of the work function 15W of the electron injection layer 15 from the absolute value of the LUMO energy level 14bL of the second electron transport layer 14b is 0 eV or less (ΔE3≤0 eV). Additionally, when T is the thickness of the electron injection layer 15, −2.3 [eV·nm]≤ΔE3×T≤−0.5 [eV·nm] is satisfied.

Figure 7:
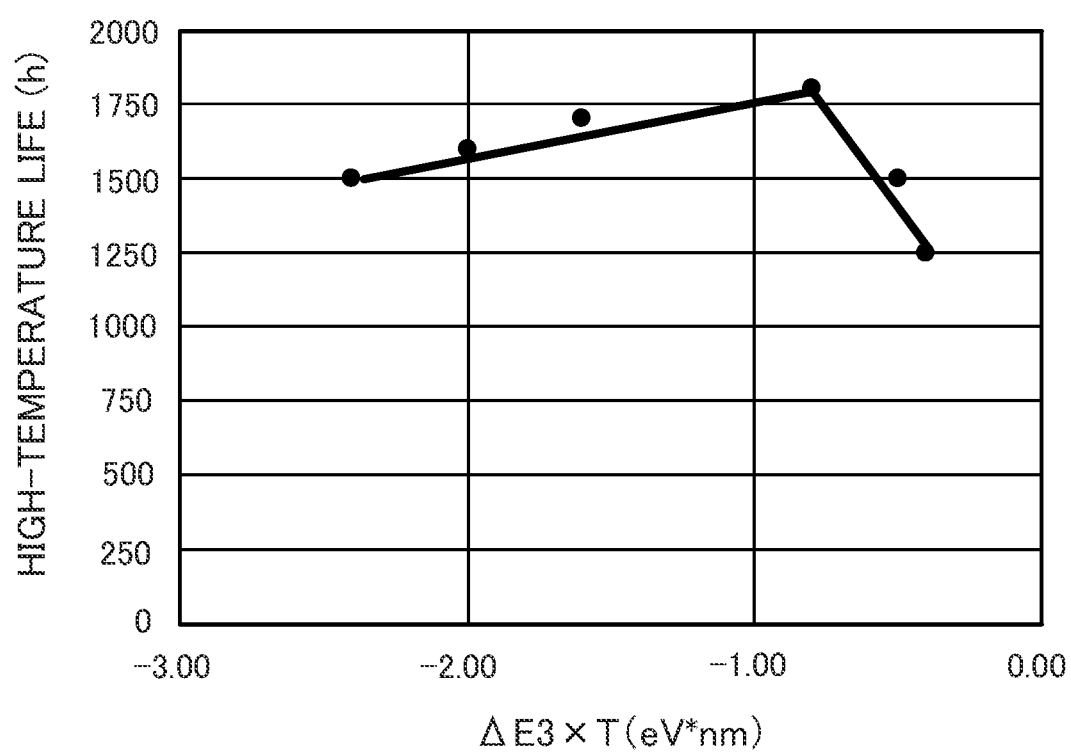
FIG. 7 is a graph illustrating the relationship between the product of an energy difference $\Delta E3$ obtained by subtracting a LUMO energy level of an electron injection layer from a LUMO energy level of an electron transport layer and a thickness T of the electron injection layer, and life in high temperature environments (high-temperature life)

FIG. 7 illustrates a graph that illustrates the relationship between the energy difference ΔE3×the thickness T [eV·nm] of the electron injection layer 15 (horizontal axis) and high-temperature life [h] (vertical axis). In general, it is preferable that the high-temperature life is 1000 hours or greater, and it is more preferable that the high-temperature life is 1500 hours or greater. Accordingly, in order to further lengthen the high-temperature life of the organic light-emitting device 1, it is preferable that ΔE3×T is −0.2 or less, and more it is more preferable that ΔE3×T is from −0.5 to −2.3.

Note that the materials of the second electron transport layer 14b and the electron injection layer 15 whereby the relationship ΔE3≤0 eV is satisfied can be selected as appropriate. Using atmospheric photoelectron yield spectroscopy, ultraviolet-visible near-infrared spectroscopy, or the like makes it possible to select a suitable material to be used for each layer. Provided that the relationship ΔE3≤0 eV is satisfied, any material may be used for the material of each layer. Additionally, the thickness T of the electron injection layer 15 can be adjusted appropriately.

Note that, when using an electrically conductive material for the electron injection layer 15, the energy difference ΔE3 is a value obtained by subtracting the absolute value of the work function of the electron injection layer 15 from the absolute value of the LUMO energy level of the second electron transport layer 14b. When using an organic material for the electron injection layer 15, the energy difference ΔE3 is a value obtained by subtracting the absolute value of the LUMO energy level of the electron injection layer 15 from the absolute value of the LUMO energy level of the second electron transport layer 14b.

Note that, according to further studies by the present inventors, it is understood that, in addition to the energy difference ΔE3×the thickness T of the electron injection layer 15, the resistance k of the electron injection layer 15 also is an important parameter for high-temperature life. Specifically, when k is the resistivity of the electron injection layer 15, excellent high-temperature life is obtained when ΔE3×T×k is at least −0.5 [eV·nm·Ωcm] or less.

Embodiment 4

Figure 10:
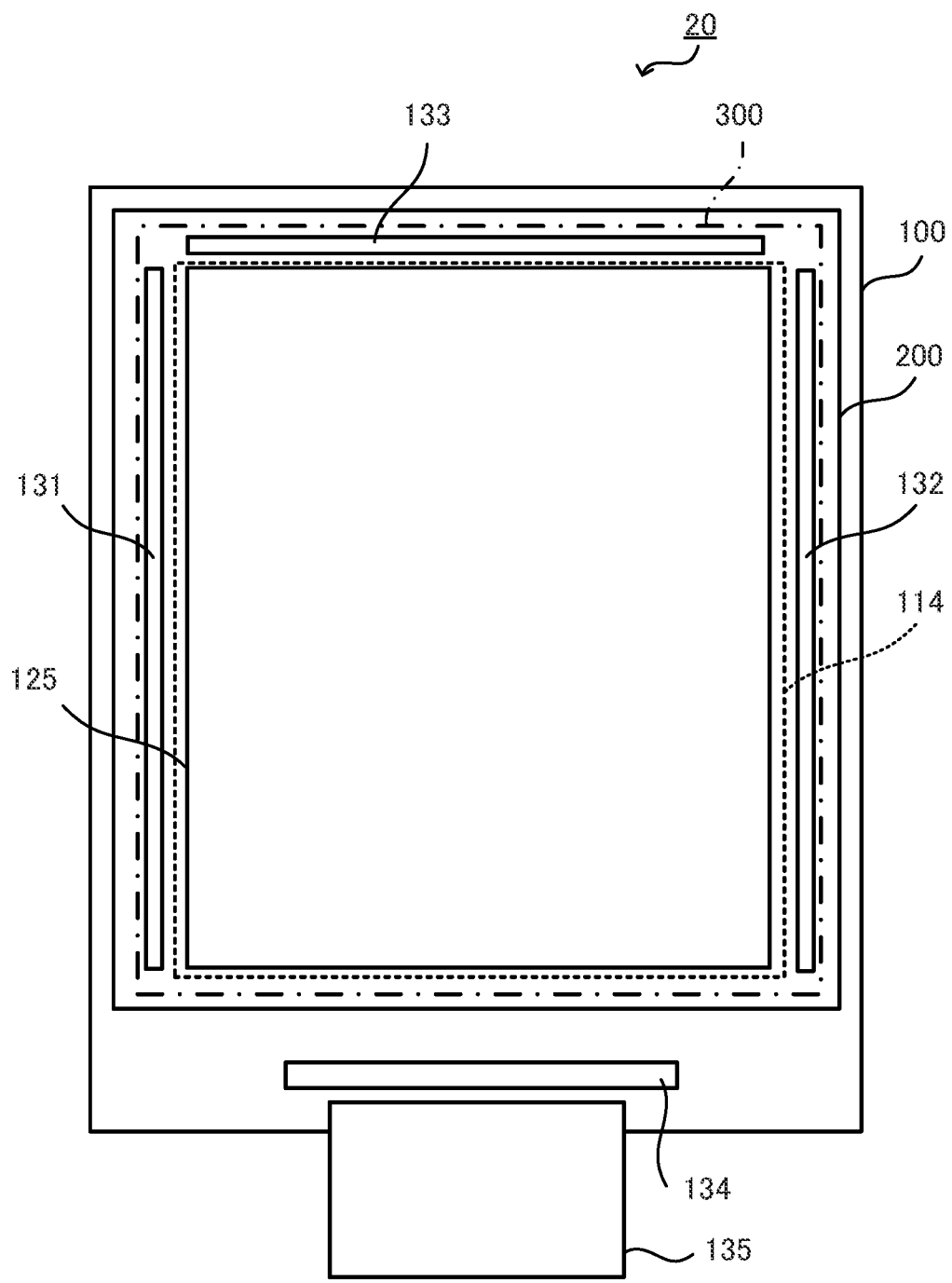
FIG. 10 is a drawing schematically illustrating a configuration example of a display device according to Embodiment 4.

Next, Embodiment 4 is described. The present embodiment relates to an OLED display device (display device) 20 that uses the organic light-emitting device 1 according to the various embodiments described above. FIG. 10 schematically illustrates a configuration example of the display device 20 according to the present embodiment.

The display device 20 includes a thin film transistor (TFT) substrate 100, a sealing substrate 200, and a bonder (glass frit bond) 300. The organic light-emitting device 1 as an OLED element is formed on the TFT substrate 100. The sealing substrate 200 is disposed opposite the TFT substrate 100. The bonder 300 is provided between the TFT substrate 100 and the sealing substrate 200, bonds the TFT substrate 100 and the sealing substrate 200 to each other, and seals the OLED element.

A scan driver 131, an emission driver 132, a protection circuit 133, and a driver integrated circuit (IC) 134 are arranged around a cathode electrode forming region 114 outside a display region 125 of the TFT substrate 100. These components are connected to an external device via a flexible printed circuit (FPC) 135.

The scan driver 131 drives scan lines of the TFT substrate 100. The emission driver 132 drives emission control lines to control a light emission period of each sub-pixel. In one example, the driver IC 134 is mounted using an anisotropic conductive film (ACF).

The driver IC 134 provides power supplies and timing signals (control signals) to the scan driver 131 and the emission driver 132, and also provides data voltage corresponding to video data to the data lines. That is, the driver IC 134 has a display control function.

The sealing substrate 200 is a transparent insulating substrate and, in one example, is implemented as a glass substrate. A λ/4 retardation plate and a polarizing plate are arranged on a light emission face (front face) of the sealing substrate 200, and suppress the reflection of light that enters from outside.

Figure 11:
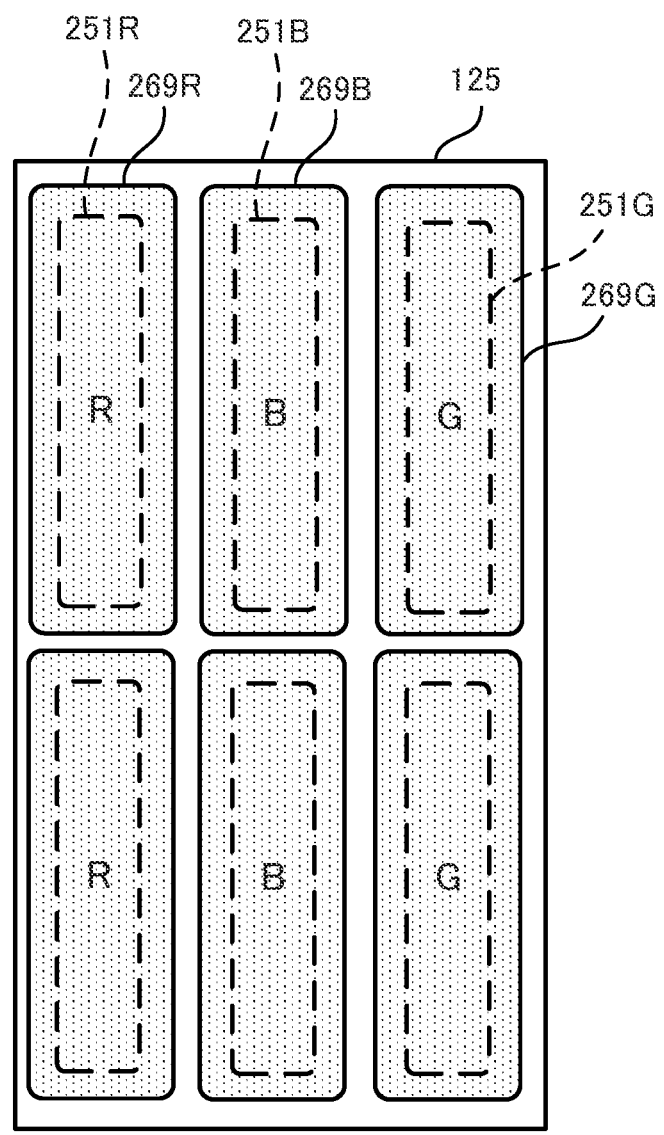
FIG. 11 is a plan view illustrating a portion of a display region of the display device.

A plurality of sub-pixels are arranged in the display region 125. FIG. 11 is a plan view illustrating a portion of the display region 125. FIG. 11 illustrates the plurality of sub-pixels arranged in a matrix. At least three of the sub-pixels are sub-pixels that emit light of a first color to a third color that differ from each other. Note that, in one example, the first color is blue, the second color is red, and the third color is green. FIG. 11 illustrates a red sub-pixel (light emission region) 251R, a blue sub-pixel (light emission region) 251B, and a green sub-pixel (light emission region) 251G. All regions of the various sub-pixels (the light emission regions) are covered by an organic light-emitting layer of the same color. Specifically, the red sub-pixels 251R, the blue sub-pixels 251B, and the green sub-pixels 251G are completely covered by a red organic light-emitting layer 269R, a blue organic light-emitting layer 269B, and a green organic light-emitting layer 269G, respectively. Of the sub-pixels illustrated in FIG. 11, only one of each of the red, blue, and green sub-pixels is marked with a reference numeral. Each of the sub-pixels displays red, blue, or green color. One pixel (main pixel) is composed of a red, blue, and green sub-pixel.

In the present embodiment, each of the sub-pixels is constituted by the organic light-emitting device 1 according to any of Embodiments 1 to 3. Accordingly, the high-temperature life of the display device 20 can be lengthened due to the effects of the configuration described in any of Embodiments 1 to 3.

Note that, in the present embodiment, the organic light-emitting device 1 that constitutes each of the sub-pixels may include all of the prominent characteristics of Embodiments 1 to 3. In addition, the organic light-emitting device 1 may include the prominent characteristics of Embodiment 1 and Embodiment 2, or the prominent characteristics of Embodiment 1 and Embodiment 3. Including one of these characteristics makes it possible to lengthen the life in high temperature environments of the display device 20.

Embodiment 5

Figure 12:
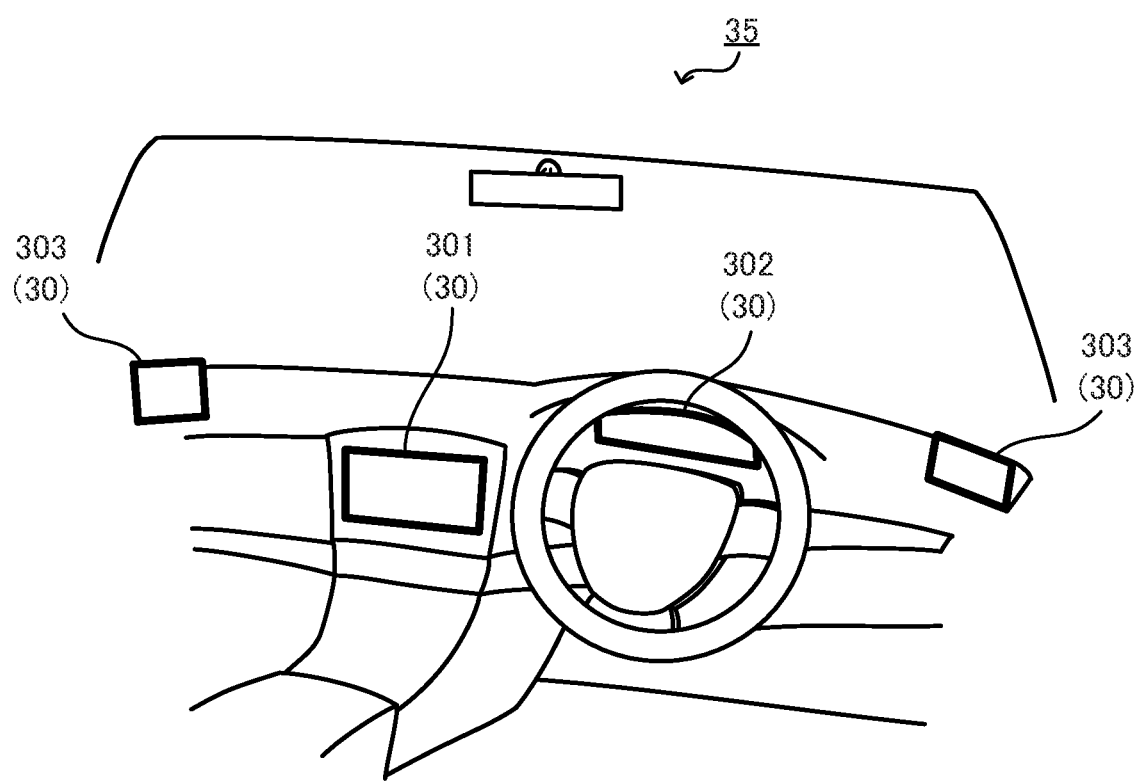
FIG. 12 is a drawing schematically illustrating an onboard display and a vehicle provided with the onboard display according to Embodiment 5.

Next, Embodiment 5 is described. The present embodiment relates to an onboard display 30 that uses the display device 20 according to Embodiment 4. FIG. 12 is a drawing illustrating a configuration example of a vehicle provided with the onboard display, and the onboard display according to the present embodiment.

The onboard display 30 is a display that is provided inside an automobile 35, as the vehicle, illustrated in FIG. 12. The onboard display 30 displays various types of information. In one example, the onboard display 30 is implemented as a center information display (CID) 301, a cluster display 302, and side displays 303 illustrated in FIG. 12. In the present embodiment, the CID 301, the cluster display 302, and the side displays 303 are displays that use the display device 20.

The CID 301 is provided in the center of a dashboard of the automobile 35. The CID 301 displays information about audio and navigation systems and an automobile status management system. The cluster display 302 displays a speedometer and the like. The side displays 303 are provided on the left and right of the dashboard, and function as side mirrors by displaying camera images.

In some cases, the interior of the automobile 35 where these onboard displays 30 are provided becomes a high temperature environment due to the effects of sunlight and the like. The high-temperature life of the onboard display 30 can be lengthened due to the use of the display device 20 that includes the organic light-emitting device 1. Accordingly, even onboard displays 30 that are exposed to high temperature environments can carry out excellent displaying for an extended period of time.

Embodiment 6

Figure 13:
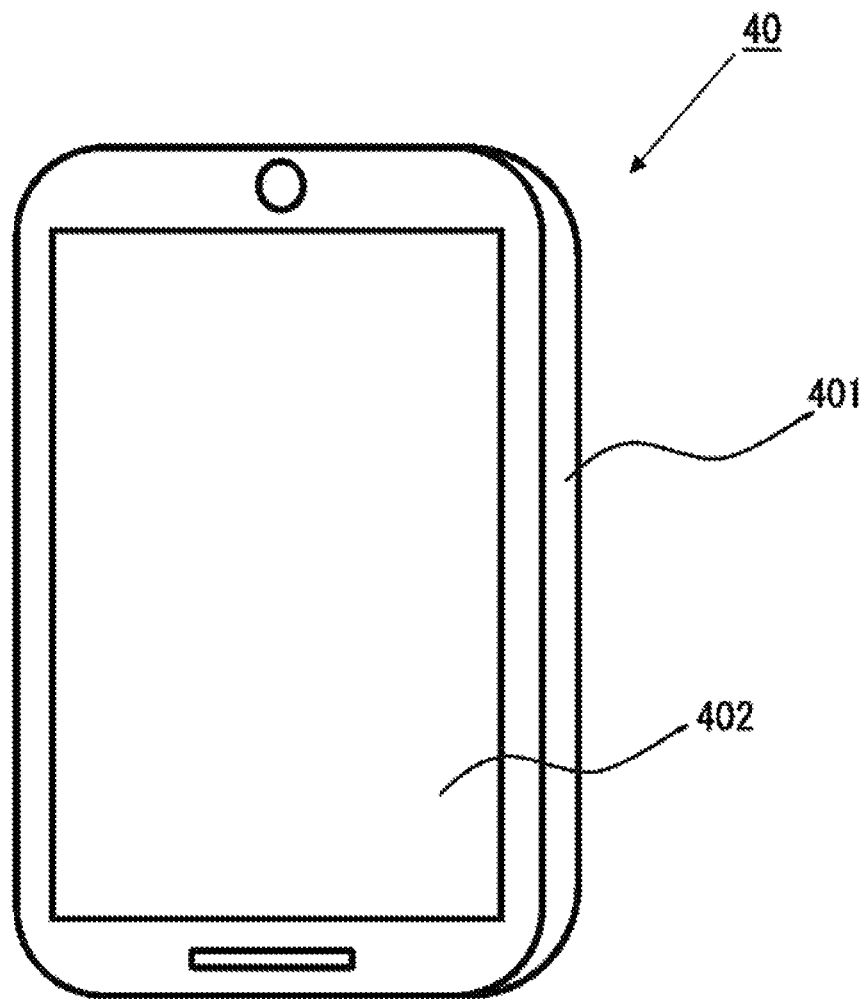
FIG. 13 is a drawing illustrating a configuration example of an electronic apparatus according to Embodiment 6.

Next, Embodiment 6 is described. The present embodiment relates to an electronic apparatus that uses the display device 20 according to Embodiment 4. FIG. 13 is a perspective view of a smartphone 40 as the electronic apparatus. With the smartphone 40, the display device 20 according to Embodiment 4 is provided in a housing 401, and a cover glass 402 that is provided on a display face side of the display device 20 is provided. Additionally, a sending/receiving device, various control devices, a storage device, an audio device including a speaker and a microphone, a battery, and other devices that have functions required for a smartphone are provided in the housing.

In some cases, the smartphone 40 may be used in high temperature environments. For example, the smartphone 40 may be used outdoors. The smartphone 40 uses the display device 20. As a result, the high-temperature life of the smartphone 40 can be lengthened. Accordingly, even smartphones 40 that are exposed to high temperature environments can carry out excellent displaying for an extended period of time.

MODIFIED EXAMPLES

The present disclosure is not limited to the embodiments described above. For example, a configuration is possible in which the organic light-emitting device 1 includes all of the prominent characteristic of Embodiment 1 (0 eV<$\Delta E1 \leq 0.32$ eV), the prominent characteristic of Embodiment 2 ($\Delta E2 \leq 0$ eV), and the prominent characteristic of Embodiment 3 ($-2.3$ [eV·nm]$\leq \Delta E3 \times T \leq -0.5$ [eV·nm]). Additionally, configurations are possible in which the organic light-emitting device 1 includes the prominent characteristics of Embodiment 1 and Embodiment 2, or the prominent characteristics of Embodiment 1 and Embodiment 3. Including the characteristic of one of these makes it possible to lengthen the life in high temperature environments of the organic light-emitting device 1.

In the embodiments described above, an example is given of a case in which the hole transport layer 12 has a bilayer structure. However, the structure of the hole transport layer 12 is not limited thereto. A configuration is possible in which the hole transport layer 12 has a single-layer structure. When a single-layer structure is adopted, the single-layer hole transport layer 12 includes the characteristic described in Embodiment 1. However, when a single-layer structure is adopted, the thickness may be insufficient for obtaining the enhancing effect based on optical resonance. As such, a stacked structure of two or more layers that includes a hole transport layer that is optically adjusted is preferable. In this way, if the prominent characteristic of Embodiment 1 can be found between the light-emitting layer 13 and a layer, of one or more layers of the hole transport layer 12, contacting the light-emitting layer 13, the life of the organic light-emitting device 1 in high temperature environments can be lengthened.

In the embodiments described above, an example is given of a case in which the electron transport layer 14 has a bilayer structure. However, the structure of the electron transport layer 14 is not limited thereto. A configuration is possible in which the electron transport layer 14 has a single-layer structure. When a single-layer structure is adopted, the single-layer electron transport layer 14 includes the characteristic described in Embodiment 2. However, when a single-layer structure is adopted, the thickness may be insufficient for obtaining the enhancing effect based on optical resonance. As such, a stacked structure of two or more layers that includes an electron transport layer that is optically adjusted is preferable. Additionally, a configuration is possible in which the electron transport layer 14 has a stacked structure of three or more layers. In this way, if the prominent characteristic of Embodiment 2 can be found between the light-emitting layer 13 and a layer, of one or more layers of the electron transport layer 14, contacting the light-emitting layer 13, contributions to lengthening the life of the organic light-emitting device 1 in high temperature environments can be obtained. Additionally, if the prominent characteristic of Embodiment 3 can be found between the electron injection layer 15 and a layer, of one or more layers of the electron transport layer 14, contacting the electron injection layer 15, the life of the organic light-emitting device 1 in high temperature environments can be lengthened.

The anode electrode 11, the light-emitting layer 13, the electron injection layer 15, and the cathode electrode 16 are not limited to single-layer structures, and may have stacked structures. Note that a configuration is possible in which the electron injection layer 15 is not formed.

The materials used in the various layers of the organic light-emitting device 1 are not limited to the materials described above in the embodiments. In particular, provided that the prominent characteristics described above can be obtained, any material may be used for the hole transport layer 12, the light-emitting layer 13, the electron transport layer 14, and the electron injection layer 15.

In Embodiment 5, an example is given in which the CID 301, the cluster display 302, and the side displays 303 are implemented as the onboard display 30, but the present disclosure is not limited thereto. The onboard display 30 can be implemented as any display to be provided in a vehicle. Additionally, the onboard display 30 may be used in industrial transportation equipment that is exposed to high temperature environments.

In Embodiment 6, an example is given in which the electronic apparatus is implemented as a smartphone, but the present disclosure is not limited thereto and the electronic apparatus may be implemented as a personal computer, a personal digital assistant (PDA), a tablet terminal, a head-mounted display, a projector, a digital (video) camera, or the like, for example.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. An organic light-emitting device, comprising:
   an anode electrode and a cathode electrode that are arranged facing each other;
   a light-emitting layer arranged between the anode electrode and the cathode electrode;
   a hole transport layer arranged between the anode electrode and the light-emitting layer, and including one or more layers; and
   an electron transport layer arranged between the light-emitting layer and the cathode electrode, and including one or more layers,
   wherein a layer, of the one or more layers of the hole transport layer, contacting the light-emitting layer has a HOMO energy level that is higher than a HOMO energy level of the light-emitting layer,
   wherein a difference between the HOMO energy level of the layer contacting the light-emitting layer of the hole transport layer and the HOMO energy level of the light-emitting layer is 0.32 eV or less, and wherein a layer, of the one or more layers of the electron transport layer, contacting the light-emitting layer has a LUMO energy level that is higher than or equal to a LUMO energy level of the light-emitting layer, the organic light-emitting device further comprising:

an electron injection layer arranged between the electron transport layer and the cathode electrode, contacting the electron transport layer, wherein the electron injection layer includes an organic material having a LUMO energy level that is less than or equal to the LUMO energy level of a layer, of the one or more layers of the electron transport layer, contacting the electron injection layer, and wherein a value obtained by multiplying an energy difference by a thickness of the electron injection layer is from −2.3 to −0.5, the energy difference being obtained by subtracting an absolute value of the LUMO energy level of the electron injection layer from an absolute value of the LUMO energy level of the layer, of the one or more layers of the electron transport layer, contacting the electron injection layer.

2. An organic light-emitting device, comprising:

an anode electrode and a cathode electrode that are arranged facing each other;

a light-emitting layer arranged between the anode electrode and the cathode electrode;

a hole transport layer arranged between the anode electrode and the light-emitting layer, and including one or more layers; and an electron transport layer arranged between the light-emitting layer and the cathode electrode, and including one or more layers, wherein a layer, of the one or more layers of the hole transport layer, contacting the light-emitting layer has a HOMO energy level that is higher than a HOMO energy level of the light-emitting layer, wherein a difference between the HOMO energy level of the layer contacting the light-emitting layer of the hole transport layer and the HOMO energy level of the light-emitting layer is 0.32 eV or less, and wherein a layer, of the one or more layers of the electron transport layer, contacting the light-emitting layer has a LUMO energy level that is higher than or equal to a LUMO energy level of the light-emitting layer, the organic light-emitting device further comprising:

an electron injection layer arranged between the electron transport layer and the cathode electrode, contacting the electron transport layer, wherein the electron injection layer includes an electrically conductive material having a work function that is less than or equal to the LUMO energy level of a layer, of the one or more layers of the electron transport layer, contacting the electron injection layer, and wherein a value obtained by multiplying an energy difference by a thickness of the electron injection layer is from −2.3 to −0.5, the energy difference being obtained by subtracting an absolute value of the work function of the electron injection layer from an absolute value of the LUMO energy level of the layer, of the one or more layers of the electron transport layer, contacting the electron injection layer.

3. The organic light-emitting device according to claim 1, wherein the layer, of the one or more layers of the electron transport layer, contacting the light-emitting layer has a thickness of from 5 nm to 50 nm.

4. A display device, comprising:
the organic light-emitting device according to claim 1.

5. An onboard display, comprising:
the display device according to claim 4.

6. An electronic apparatus, comprising:
the display device according to claim 4.

7. A vehicle, comprising:
the onboard display according to claim 5.

8. The organic light-emitting device according to claim 1, wherein the layer, of the one or more layers of the hole transport layer, contacting the light-emitting layer has a thickness of from 5 nm to 50 nm.

9. The organic light-emitting device according to claim 2, wherein the layer, of the one or more layers of the electron transport layer, contacting the light-emitting layer has a thickness of from 5 nm to 50 nm.

10. A display device, comprising:
the organic light-emitting device according to claim 2.

11. An onboard display, comprising:
the display device according to claim 10.

12. An electronic apparatus, comprising:
the display device according to claim 10.

13. A vehicle, comprising:
the onboard display according to claim 11.

14. The organic light-emitting device according to claim 2,
wherein the layer, of the one or more layers of the hole transport layer, contacting the light-emitting layer has a thickness of from 5 nm to 50 nm.

* * * * *